United States Patent
Chen et al.

(10) Patent No.: US 6,533,592 B1
(45) Date of Patent: Mar. 18, 2003

(54) ASSEMBLY OF AN ELECTRICAL CONNECTOR AND A PICK-UP CAP

(75) Inventors: Hsiang-Ping Chen, Tu-Chen (TW); Sung-Pei Hou, Tu-Chen (TW)

(73) Assignee: Hon Hai Precision Ind. Co., Ltd., Taipei Hsien (TW)

(*) Notice: Subject to any disclaimer, the term of this patent is extended or adjusted under 35 U.S.C. 154(b) by 0 days.

(21) Appl. No.: 10/040,533

(22) Filed: Dec. 28, 2001

(51) Int. Cl.[7] .................................................. H01R 13/44
(52) U.S. Cl. ...................................... 439/135; 439/940
(58) Field of Search ................................. 439/135, 940

(56) References Cited

U.S. PATENT DOCUMENTS 5,688,133 A * 11/1997 Ikesugi et al. ............. 439/940
6,142,798 A * 11/2000 Tran et al. .................. 439/135
6,146,155 A * 11/2000 Boling et al. ............... 439/940
6,155,848 A * 12/2000 Lin ............................. 439/940

* cited by examiner

*Primary Examiner*—Gary Paumen
(74) *Attorney, Agent, or Firm*—Wei Te Chung

(57) ABSTRACT

An electronic device includes an electrical connector (1) and an auxiliary cap (2) attached onto the connector. The cap has a smooth surface (21) to which a vacuum suction device may be applied to pick up the cap together with the connector. The connector includes an insulative member (10) and a number of contacts (100) retained in the insulative member. The insulative member defines a rectangular opening (121) at a center thereof. The cap has two latches (215, 216) downwardly extending to reside at positions substantially corresponding to and engaging two diagonal corners (128, 129) of the rectangular opening of the insulative thereby retaining the cap to the connector.

4 Claims, 6 Drawing Sheets

ASSEMBLY OF AN ELECTRICAL CONNECTOR AND A PICK-UP CAP

BACKGROUND OF THE INVENTION

1. Field of the Invention

The present invention relates to a connector and a cap for picking up the connector by a vacuum suction device, and particularly to means for joining the cap and the connector together and providing a larger smooth area for the vacuum suction device.

2. Description of the Related Art

Some electrical connectors are too small to be picked up by a clip when they are mounted onto a printed circuit board (PCB). Such connectors include mini board-to-board connector, CPU socket and so on. Vacuum pump is an ideal tool for picking up and moving such connectors. The connectors each must provide a smooth area to which suction force is applied for picking up the connectors. Some connectors do not have required the smooth area, so auxiliary devices, for example, caps, attachable to the connectors for providing smooth area are widely used. The caps must securely engage with the connectors, otherwise the connectors may fall apart from the caps when they are picked up and moved to the PCBs. On the other hand, the smooth area must be large enough to induce or create sufficient suction force so that the connector together with the cap may not fall. The caps must be conveniently removed from the connectors after the connectors are securely mounted onto corresponding PCBs.

Referring to FIG. 6, a ball grid array (BGA) socket 4 and a cap 3 attached onto the BGA socket 4 are illustrated. The cap 3 defines four openings 31 adjacent corners thereof for facilitating transmitting heat. Near the center of the cap 3, there are three notches 32 located at corners of a triangle. Under each notch 32, there is a latch (not labeled) engaging with the connector 4 for joining the cap 3 with the connector 4. The notches 32 are defined for facilitating disengaging the latches from the connector 4 after the connector is properly mounted onto a printed circuit board (PCB). Surrounded by the three notches 32, there is a smooth area, designated by a circle "A", that a vacuum pump adheres to for picking up the cap 3 together with the connector 4. The circle "A" is limited by the locations of the notches 32 and has a largest diameter "d2" which is about 14.46 mm. So, the largest acreage of the smooth area is about 164.14 mm$^2$. This invention is trying to provide a cap providing a larger area for a vacuum pump to pick up the cap and a connector that the cap is attached to.

SUMMARY OF THE INVENTION

An objective of the present invention is to provide an assembly of an electrical connector and a cap attached onto the connector for facilitating a vacuum pump to pick up and move the connector to desired position, wherein the cap provides a large smooth area for the pump securely picking up the cap and the connector.

To obtain the above objective, a connector includes an insulative member and a number of contacts retained in the insulative member. The insulative member defines a rectangular opening at a center thereof. An auxiliary cap engageable with the connector provides a smooth area to which a vacuum suction device may be applied for picking up the connector. The cap has two latches downwardly extending to reside at engage two diagonal corners of the rectangular opening of the insulative member thereby retaining the cap to the connector. The cap may provide a larger smooth area than the conventional cap because of the locations of the latches at diagonal corners of the rectangular opening of the insulative member.

Other objects, advantages and novel features of the invention will become more apparent from the following detailed description of the present embodiment when taken in conjunction with the accompanying drawings.

DESCRIPTION OF THE PREFERRED EMBODIMENT

Figure 1:
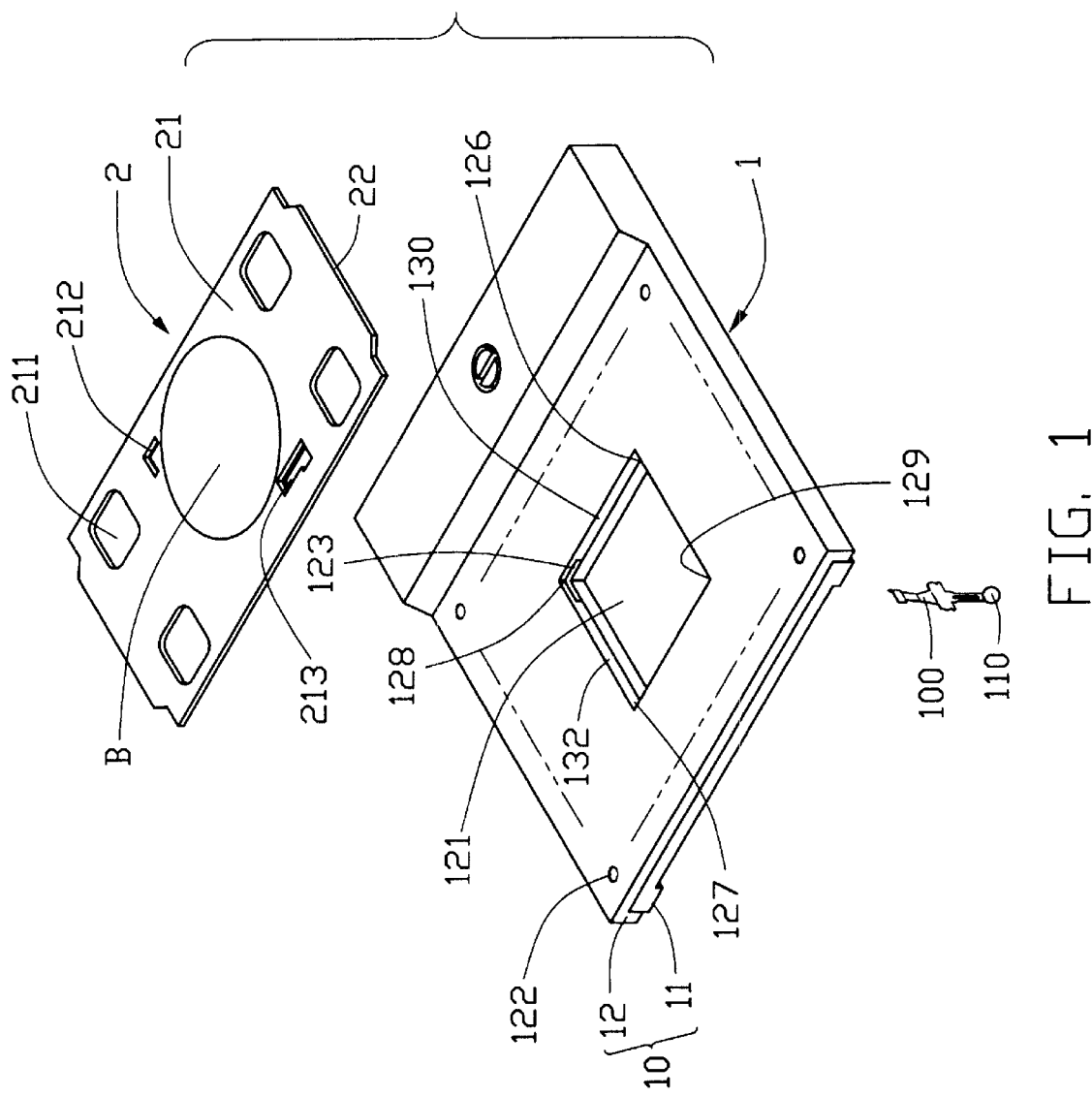
FIG. 1 is a top perspective view of an electrical connector and a cap of the present invention, wherein a conductive contact is moved out from the connector.
Figure 3:
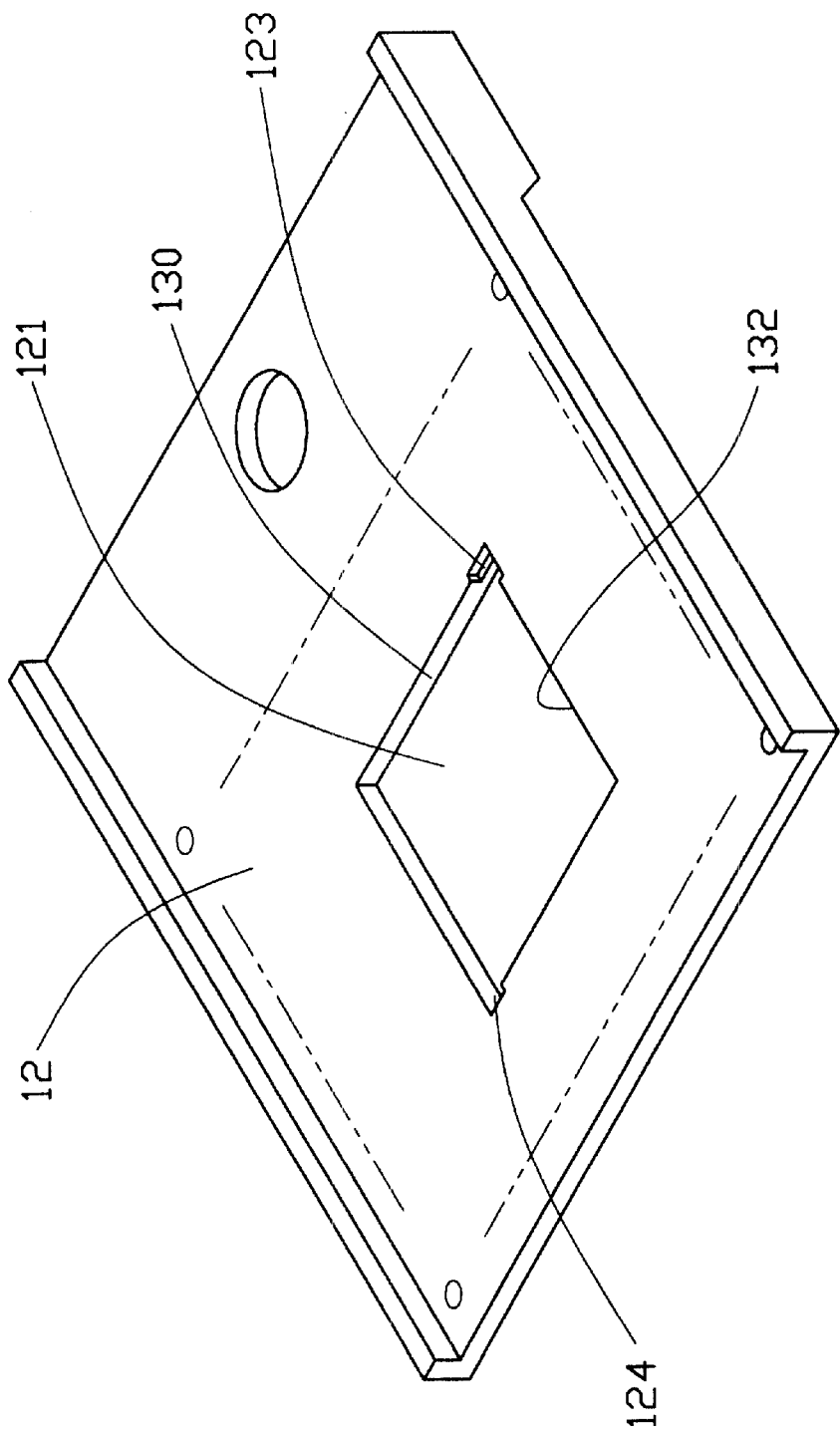
FIG. 3 is an enlarged bottom perspective view of a cover of the electrical connector in FIG. 1.

Referring to FIG. 1, an electrical connector 1 includes an insulative member 10 and a plurality of conductive contacts 100 retained in the insulative member 10. The insulative member 10 defines a rectangular opening 121 at a center thereof and a plurality of holes 122 out of the area of the rectangular opening 121. The rectangular opening 121 includes two pairs of diagonal corners 126, 127, 128, 129. The insulative member 10 preferably includes an insulative base 11 and an insulative cover 12 movably attached onto the insulative base. The contacts 100 are actually retained in the base 11. Each contact 100 has a solder ball 110 attached thereto. Referring to FIG. 3, the cover 12 defines two notches 123, 124 at the diagonal corners 128, 129 of the rectangular opening 121.

Figure 2:
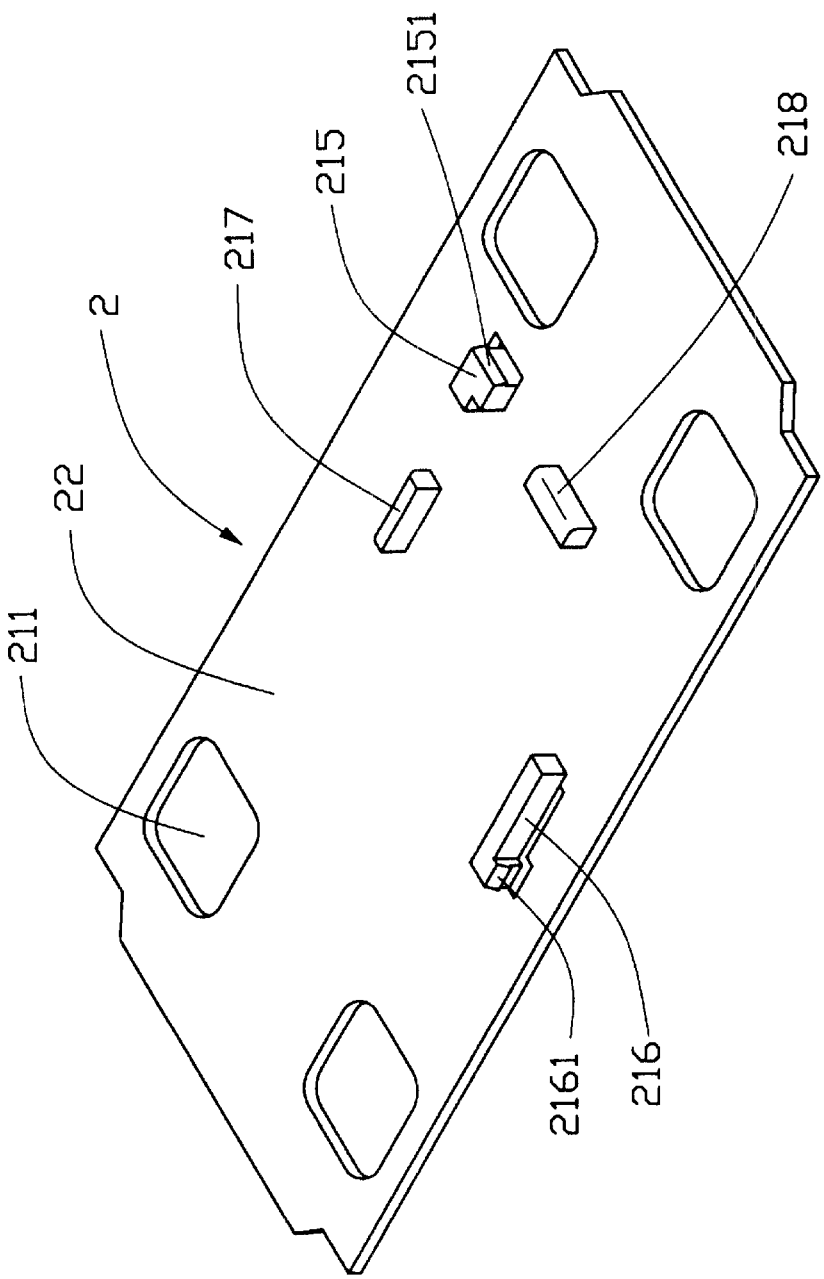
FIG. 2 is an enlarged bottom perspective view of the cap in FIG. 1.

Referring to FIG. 2 in conjunction with FIG. 1, the cap 2 has an upper surface 21 and a lower surface 22 and defines four windows 211 adjacent four corners thereof for transmitting heat therethrough. The cap 2 defines two slits 212, 213 through the upper and the lower surfaces 21, 22 thereof which are in accordance with the diagonal corners 128, 129 of the connector 1. Under the slits 212, 213, there are two latches 215, 216 that extend downwardly beyond the lower surface 22 of the cap 2. The latch 215 has a bar 2151 at tip thereof and the latch 216 has a bar 2161 at a tip thereof. The cap 2 has two perpendicular blocks 217, 218 on the lower surface 22 thereof in accordance with two perpendicular peripheral sides 130, 132 of the rectangular opening 121.

Figure 4:
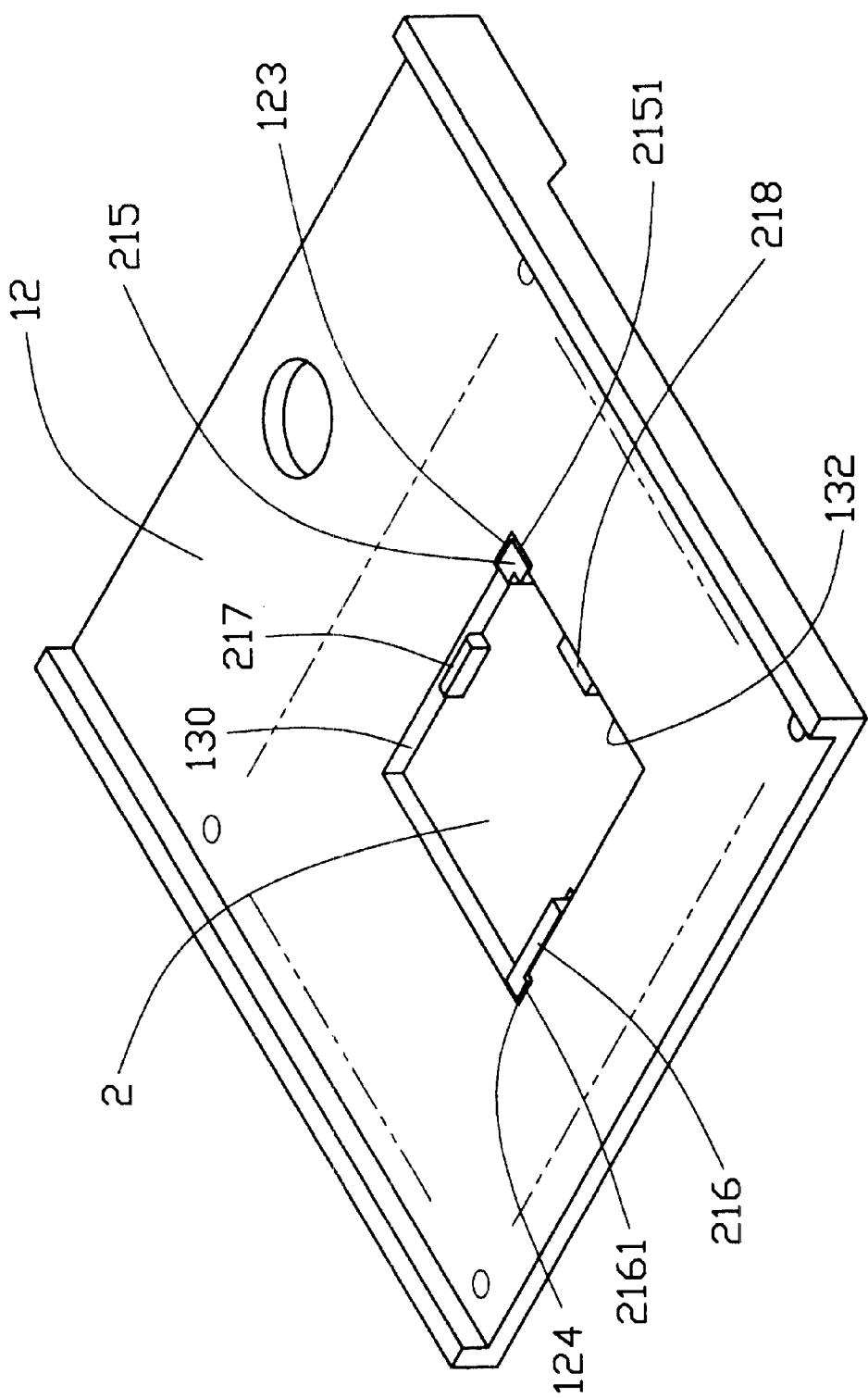
FIG. 4 is a view similar to FIG. 3 but the cap is attached to the cover.
Figure 5:
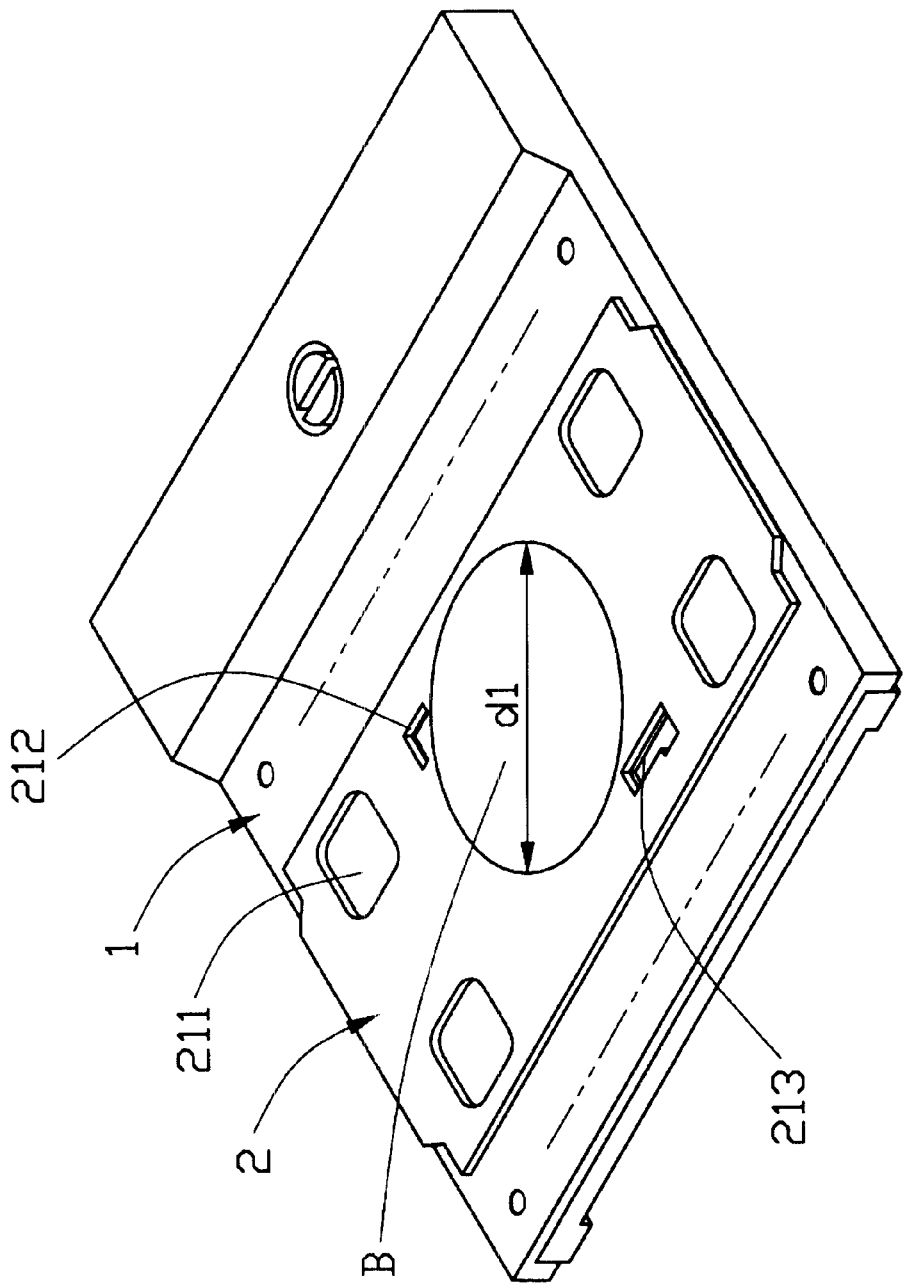
FIG. 5 is an assembled view of FIG. 1.

Referring to FIGS. 4 and 5, when the cap 2 is attached onto the connector 1, the lower surface 22 confronts the connector 1 and the blocks 217, 218 respectively bear against the peripheral sides 130, 132 to locate the cap 2 at correct position relative to the connector 1. The latches 215, 216 locate at the diagonal corners 126, 127, respectively and the bars 2151, 2161 are fixedly received in the notches 123, 124, respectively, thereby joining the cap 2 with the connector 1.

Figure 6:
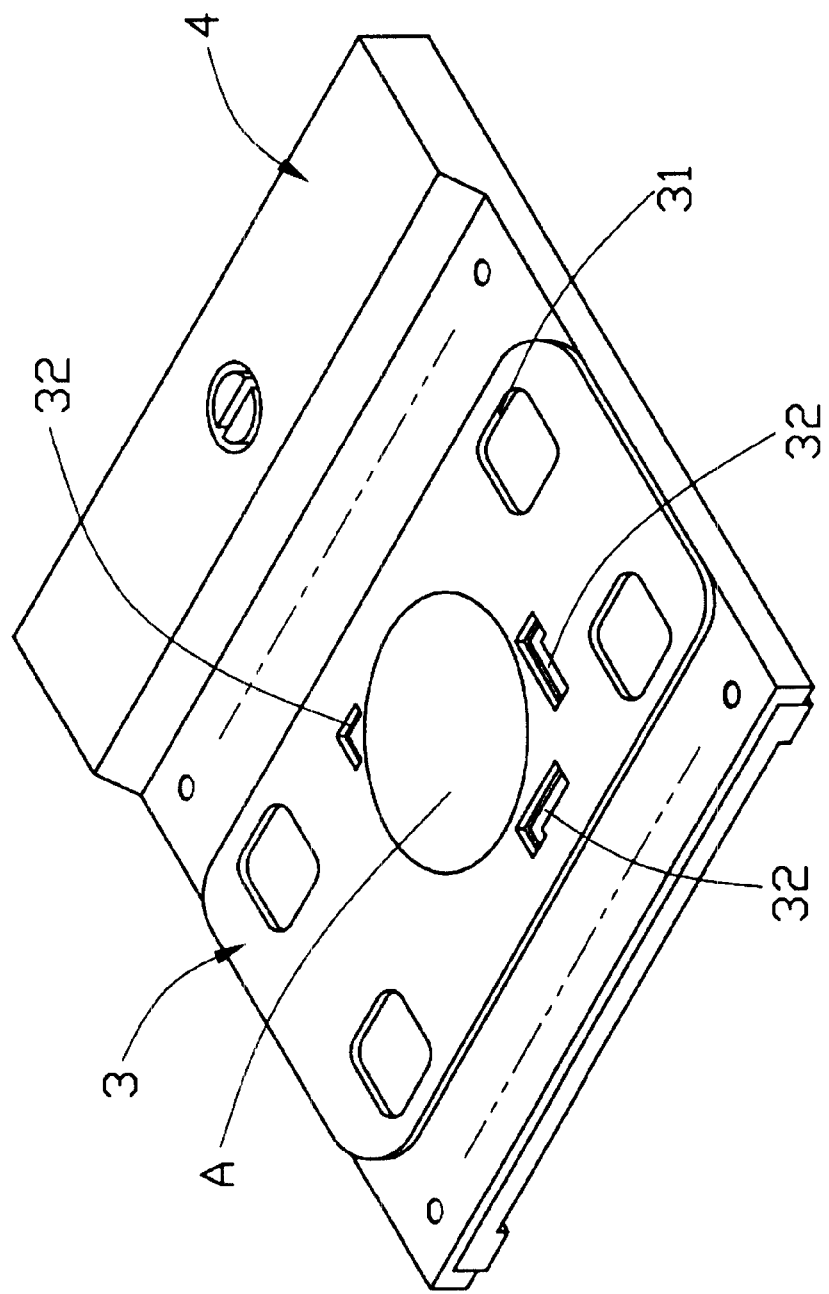
FIG. 6 is a perspective view of a conventional assembly of an electrical connector and a cap attached to the connector.

Comparing with the conventional connector 4 and the conventional cap 3 in FIG. 6, the cap 2 of this invention only has two latches 215, 216 located at the two diagonal corners 128, 129. The smooth area, designated by the circle "B", may be larger than that of the conventional cap 3. The circle "B" has a largest diameter "d1" about 16.06 mm, thereby the largest acreage of the circle "B" is about 202.47 mm$^2$. So, the acreage of the smooth area of this invention is 23.35 percents more than that of the convention cap 3.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electronic device comprising:

an electrical connector including an insulative member and a plurality of conductive contacts retained in the insulative member, the insulative member defining a rectangular opening at a center thereof;

a cap having an upper surface, a lower surface and two latches downwardly extending beyond the lower surface, the two latches residing at positions substantially corresponding to and engaging two diagonal corners of the rectangular opening of the insulative member, the upper surface having a smooth area to which a vacuum suction device may be applied to pick up the cap together with the electrical connector;

wherein the insulative member defines a notch at each of said diagonal corners and the latches each have a bar that is engageably received in a corresponding notch;

wherein at least one of the latches is elastic;

wherein the cap provides two blocks bearing against two perpendicular peripheral sides of the rectangular opening for retaining the cap at the correct position relative to the insulative member;

wherein the insulative member includes an insulative base and an insulative cover movable relative to the insulative base, the notches being defined in the cover.

2. An electrical assembly comprising:

a socket defining an insulative housing with a plurality of contacts therein;

a rectangular opening being defined at a center portion of said housing;

first and second engaging devices formed substantially located at a pair of diagonal corners of said opening;

a cap defining opposite upper and lower surfaces, first and second latching devices extending from the lower surface in alignment with the corresponding first and second engaging devices in a vertical direction, respectively; wherein first and second slits formed in the upper surfaces corresponding to forming said first and second latching devices, are substantially located at a pair of diagonal comers of an imaginary rectangular configuration in compliance with said rectangular opening, thus providing a maximum central vacuum area;

wherein said first latch is stiff while said second latch is resilient;

wherein said second latch is essentially of a cantilever type including a locking bar locked with the second engaging device.

3. A connector assembly comprising:

a socket;

a plate mounted upon said socket and defining upper and lower surfaces thereof;

a stiff first latch device formed on said lower surface with a right angle configuration in a plane view;

a resilient second latch device formed on said lower surface with a L-like configuration in the plane view, said second latch with an elongated body integrally extending from the lower surfaces in a horizontal direction with a locking bar at a free end thereof;

a first slit formed in the upper surface generally alignment with said first latch device;

a second slit formed in the upper surface generally alignment with said second latch device; wherein said first latch device and the locking bar of said second latch device are substantially located at two diagonal corners of an imaginary rectangle which is essentially compliant with a rectangular opening defined in said socket.

4. The cap as claimed in claim 3, wherein said horizontal direction complies with one side of said imaginary rectangle.

* * * * *